US007498884B2

(12) United States Patent
Kwon et al.

(10) Patent No.: US 7,498,884 B2
(45) Date of Patent: Mar. 3, 2009

(54) SELF CALIBRATING RC OSCILLATOR

(75) Inventors: Yong Il Kwon, Gyunggi-Do (KR); Tah Joon Park, Gyunggi-Do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 88 days.

(21) Appl. No.: 11/754,089

(22) Filed: May 25, 2007

(65) Prior Publication Data

US 2007/0285185 A1 Dec. 13, 2007

(30) Foreign Application Priority Data

May 26, 2006 (KR) ...................... 10-2006-0047722

(51) Int. Cl.
*H03L 7/00* (2006.01)
*H03L 7/02* (2006.01)
*H03L 7/06* (2006.01)

(52) U.S. Cl. ........................... 331/1 R; 331/11; 331/25; 331/66

(58) Field of Classification Search ................. 331/1 R, 331/10, 11, 17, 18, 25, 65, 66, 111, 143, 331/175, 176; 327/156–159
See application file for complete search history.

(56) References Cited

U.S. PATENT DOCUMENTS 7,298,219 B2 * 11/2007 Dosho et al. .................. 331/16

* cited by examiner

*Primary Examiner*—David Mis
(74) *Attorney, Agent, or Firm*—Lowe Hauptman Ham & Berner

(57) ABSTRACT

There is disclosed a self-calibrating resistor-capacitor (RC) oscillator in which a resistor has a resistance value varied minimally by temperature change and process variation, a capacitor has a capacitance value selected adequately according to needs, and the resistor and capacitor are configurable as a one-chip by a complementary metal-oxide semiconductor (CMOS) process. The self-calibrating RC oscillator comprises a resistor part including a first resistor having a resistance value reduced with increase in temperature and a second resistor connected in series with the first resistor and having a resistance value increasing with increase in temperature.

4 Claims, 3 Drawing Sheets

SELF CALIBRATING RC OSCILLATOR

CLAIM OF PRIORITY

This application claims the benefit of Korean Patent Application No. 2006-47722 filed on May 26, 2006 in the Korean Intellectual Property Office, the disclosure of which is incorporated herein by reference.

BACKGROUND OF THE INVENTION

1. Field of the Invention

The present invention relates to a resistor-capacitor (RC) oscillator in which a resonance frequency is determined by a resistor and a capacitor, and more particularly, to a self-calibrating RC oscillator which is less dependent on change in external temperature and can be integrated into one chip.

2. Description of the Related Art

In 2000, the Institute of Electrical and Electronics Engineers (IEEE) launched a move to standardize a low-speed wireless private network application into IEEE 802.15.4. This standardized version requires a battery to run for at least 5 to 7 years, which thus necessitates designing of a circuit consuming minimal power. The most widely known technology for minimizing power consumption is to turn off a circuit when it does not need to be in operation.

Meanwhile, in a system where a power is turned off during deactivation for less power consumption, the power should be turned on and off through a shorter time to reduce power consumption of the system. Especially, this characteristic is notably important in an oscillator circuit for generating a reference frequency which is essentially used in a telecommunication system.

In general, a conventional crystal oscillator needs time for self-start to amplify noises generated internally to an operational level. Accordingly, the conventional crystal oscillator entails a long operation time and significant power consumption to start oscillating. In consequence, the crystal oscillator with such operation time and power consumption is ill-suitable for a system which has a power turned off during deactivation to minimize power consumption.

To overcome problems with the conventional crystal oscillator, a resistor-capacitor (RC) oscillator has been suggested. The RC oscillator is inexpensive, low in power consumption, short in starting time and easily controllable in a frequency.

FIG. 1 is a block diagram illustrating a configuration of a conventional RC oscillator. As shown in FIG. 1, the conventional RC oscillator includes a resistor part R, a capacitor part C, a bias circuit 11, a lamp-hold circuit 12, a comparator 12, a divider 14, a charge pump 15 and an oscillator part 16.

In a brief explanation of the conventional RC oscillator, the bias circuit 11 generates a preset reference voltage $V_{REF1}$, and a ramp current $I_{RAMP}$ to be proportional to the reference voltage $V_{REF1}$ and inversely proportional to a resistance value of the resistor part R.

The ramp and hold circuit 12 charges the capacitor part C using the ramp current during a predetermined charging time. Here, the charging time is set by the divider 14 which divides a period of an oscillation signal outputted from the RC oscillator by a predetermined divide ratio. The charging time is proportional to the period of the oscillation signal of the RC oscillator. After the charging, the ramp and hold circuit 12 maintains a both-end voltage of the capacitor part C.

The comparator 13 compares the reference voltage with the both-end voltage of the capacitor part C and outputs a comparison result. The divider 14 controls the charge pump 15 to increase or decrease a control voltage of the oscillator part 16. That is, in a case where the both-end voltage of the capacitor part C is greater than the reference voltage based on the comparison result, the comparator 13 increases a voltage $V_{CP}$ supplied to the oscillator part 16 by the charge pump 15, thereby increasing a frequency of the oscillation signal outputted from the oscillator part 16. In contrast, in a case where the both-end voltage of the capacitor part C is smaller than the reference voltage based on the comparison result, the comparator 13 decreases the voltage $V_{CP}$ supplied to the oscillator part 16 by the charge pump 15, thereby decreasing the frequency of the oscillation signal outputted from the oscillator part 16.

In this conventional RC oscillator, the oscillation signal has the frequency determined by the resistance value of the resistor part R and a capacitance value of the capacitor part C. Therefore, in order to obtain the oscillation signal with a desired frequency, it is of great importance to manufacture the RC oscillator in which the resistance value and capacitance value have a predetermined value in designing a circuit.

However, the resistor part R and the capacitor part C, when configured as a one-chip by a complementary metal-oxide semiconductor (CMOS) process, have the resistance value and capacitance value widely varied according to temperature change and process variation. For example, an RC time constant may be varied by about ±50%. In consequence, conventionally, the resistor and the capacitor are hardly integrated with other circuits into one chip. Yet, an external lumped resistor and capacitor having adequately selected values respectively are connected to the circuit 'A' configured as a one-chip.

SUMMARY OF THE INVENTION

The present invention has been made to solve the foregoing problems of the prior art and therefore an aspect of the present invention is to provide a self-calibrating resistor-capacitor (RC) oscillator in which a resistor has a resistance value varied minimally by temperature change and process variation, a capacitor has a capacitance value selected adequately according to needs, and the resistor and capacitor are configurable as a one-chip by a complementary metal-oxide semiconductor (CMOS) process.

According to an aspect of the invention, the invention provides a self-calibrating resistor-capacitor (RC) oscillator for generating an oscillation signal including a resistor part including a first resistor having a resistance value reduced with increase in temperature and a second resistor connected in series with the first resistor and having a resistance value increasing with increase in temperature, the resistor part having a resistance value formed by the first and second resistors connected in series with each other; a bias circuit generating a preset first reference voltage, and a ramp current to be proportional to the first reference voltage and inversely proportional to the resistance value of the resistor part; a capacitor part having a capacitance value; a ramp and hold circuit supplying the ramp current to the capacitor part to charge the capacitor part during a charging time set according to a period of the oscillation signal, and maintaining a both-end voltage of the capacitor part after the charging; a first comparator comparing a size of the first reference voltage with a size of the both-end voltage of the capacitor part; a first charge pump for outputting a control voltage varying in response to a control signal; a control logic outputting the control signal for increasing and decreasing the control voltage outputted from the first charge pump in response to a comparison result of the first comparator, receiving the oscillation signal through feed-back, and setting the charging time during which the ramp and hold circuit supplies the ramp current to the capacitor part, in response to the received oscillation signal; and an oscillator part for outputting the oscillation signal having a frequency controlled in response to the control voltage of the first charge pump.

According to a preferred embodiment of the invention, the capacitor part includes a plurality of switches connected in parallel with one another to a terminal to which the ramp current is inputted; and a plurality of capacitors each having one end connected to a corresponding one of the switches and another end grounded, wherein the control logic controls on/off of the switches.

According to another preferred embodiment of the invention, the self-calibrating RC oscillator further comprises a crystal resonance part generating a reference frequency from a resonance signal generated from a crystal resonator; a phase frequency detector for comparing a frequency of the oscillation signal with the reference frequency; a second charge pump for outputting a comparison voltage controlled in response to a comparison result of the phase frequency detector; and a second comparator for comparing the comparison voltage outputted from the second charge pump with a preset second reference voltage to provide to the control logic, wherein the control logic controls on/off of the switches in response to a comparison result of the second comparator to determine the capacitance value of the capacitor part.

The self-calibrating RC oscillator may further include a storage for storing on/off status of the switches in response to the comparison result of the second comparator.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
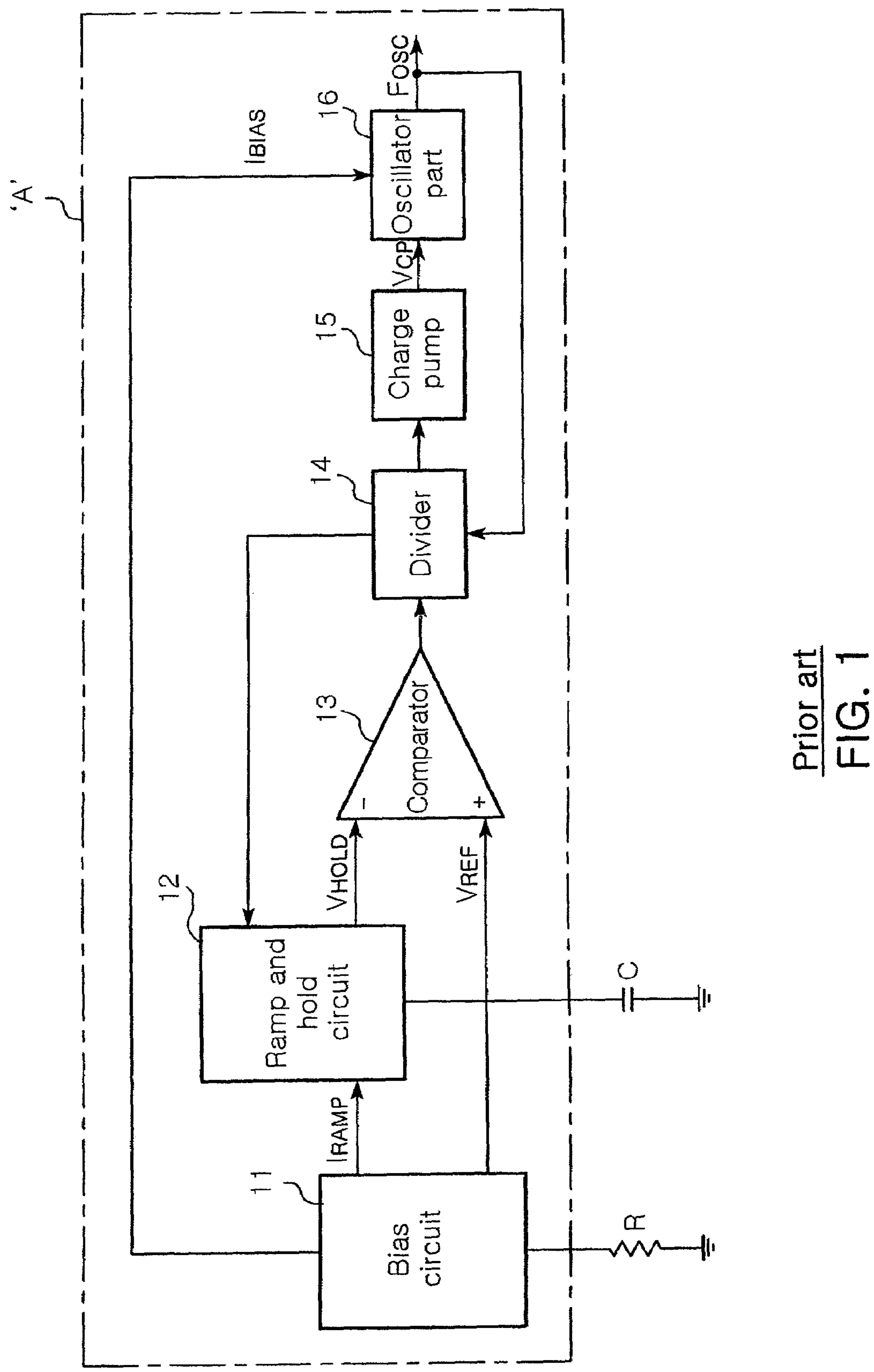
FIG. 1 is block diagram illustrating a configuration of a conventional RC oscillator.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shape and dimensions may be exaggerated for clarity, and the same reference signs are used to designate the same or similar components throughout.

Figure 2:
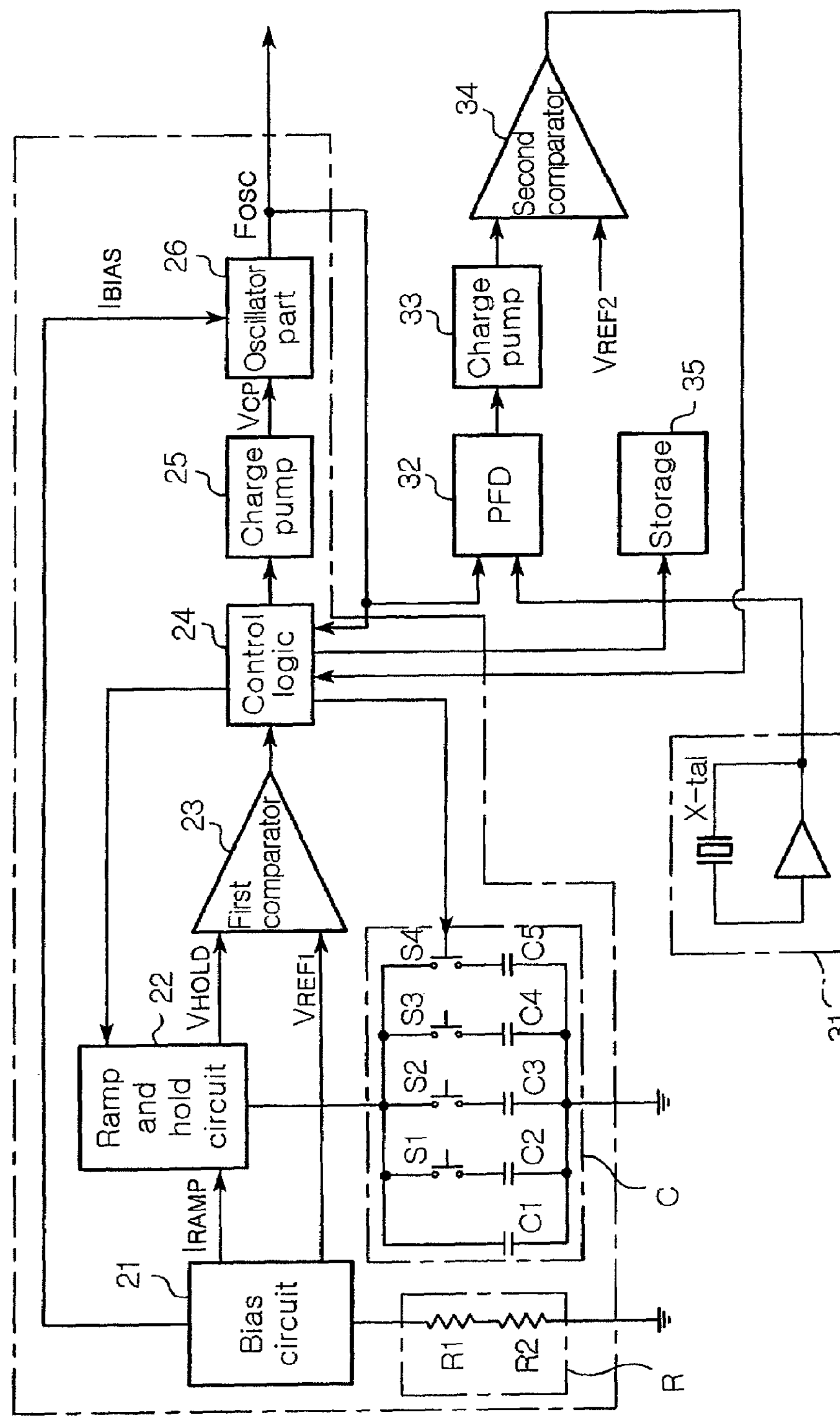
FIG. 2 is a block diagram illustrating a configuration of an RC oscillator according to an embodiment of the invention.

FIG. 2 is a block diagram illustrating a resistor-capacitor (RC) oscillator according to an exemplary embodiment of the invention. Referring to FIG. 2, the RC oscillator according to an embodiment of the invention includes a resistor part R, a capacitor part C, a bias circuit 21, a ramp and hold circuit 22, a first comparator 23, a control logic 24, a first charge pump 25 and an oscillator part 26.

In addition to these constituents, the RC oscillator according to this embodiment may further include a crystal resonator 31, a phase frequency detector 32, a second charge pump 33, a second comparator 34 and a storage 35.

The resistor part R includes a first resistor R1 having a resistance value reduced with increase in temperature and a second resistor R2 connected in series with the first resistor R1 and having a resistance value increasing with increase in temperature. It has been known in the art that a resistor having a resistance value increasing or decreasing with increase in temperature can be manufactured by a complementary metal-oxide semiconductor (CMOS) process.

Figure 3:
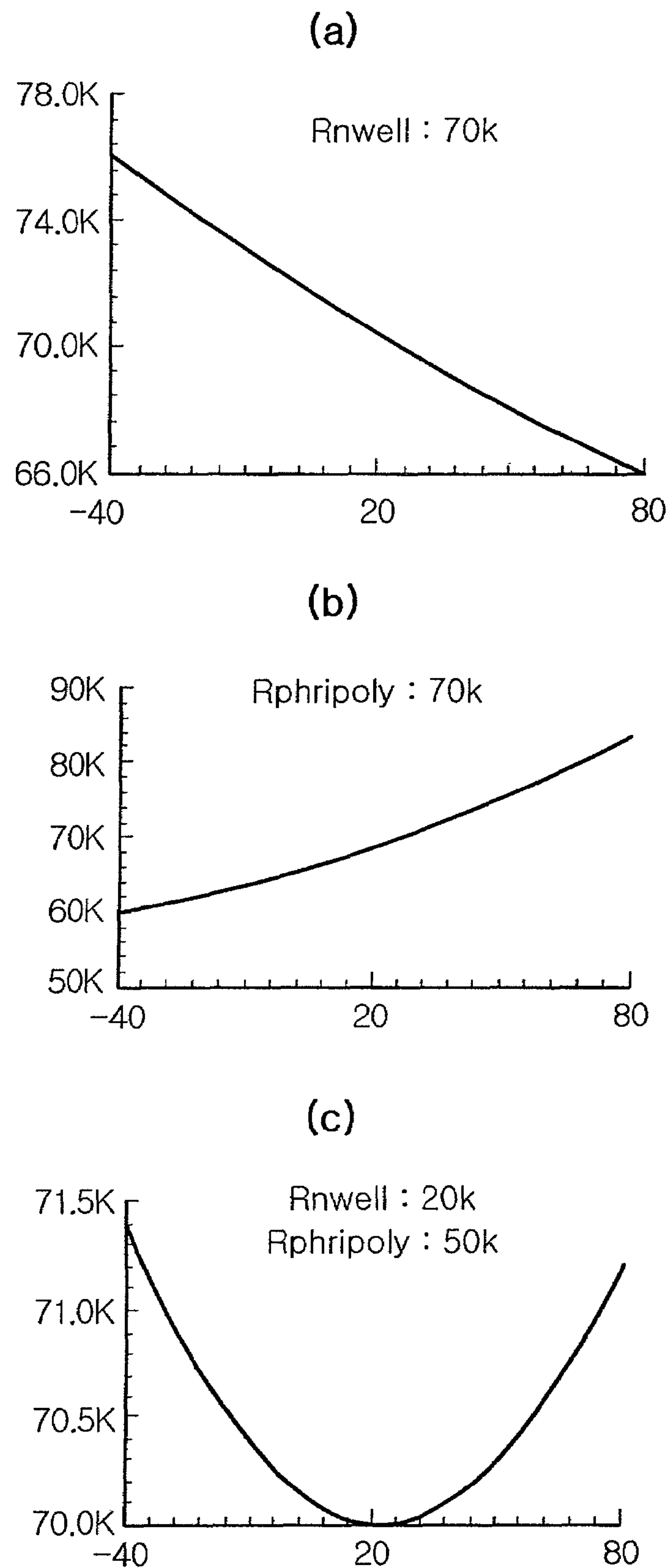
FIG. 3 is a graph illustrating temperature characteristics of a resistor applied to the invention.

FIG. 3 illustrates a graph illustrating resistance values of the first and second resistors R1 and R2, varying with temperature. As shown in FIG. 3(*a*), the first resistor R1 has a resistance value reduced from about 76 kΩ to about 66 kΩ at a temperature ranging from −40 □ to 80 □. Also, as shown in FIG. 3(*b*), the second resistor R2 has a resistance value reduced from about 60 kΩ to about 85 kΩ at a temperature ranging from −40 □ to 80 □. According to this exemplary embodiment of the invention, as shown in FIGS. 3(*a*) and (*b*), the resistors with two temperature-dependent characteristics are connected in series with each other. Accordingly, the two characteristics are cancelled out, thereby reducing a variation range of the resistance values.

FIG. 3(*c*) is a graph illustrating temperature dependence of a resistance value in a case where the first resistor R1 and the second resistor R2 are connected in series with each other. As shown in FIG. 3(*c*), the resistance value in the structure having the two resistors connected in series is varied by about 70 kΩ to about 71.5 kΩ at a temperature ranging from −40 □ to 80 □. That is, even in case of a big change in temperature, the resistance value is varied by about 1.5 kΩ. Therefore, by connecting the first resistor R1 and the second resistor R2 in series with each other as described above, the RC oscillator may be notably reduced in variations of an oscillation frequency, caused by temperature-induced variation in the resistance value.

Referring back to FIG. 2, the bias circuit 21 generates a preset first reference voltage $V_{REF1}$, and a ramp current $I_{RAMP}$ to be proportional to the first reference voltage $V_{REF1}$ and inversely proportional to the resistance value of the resistor part R.

The capacitor part C may be embodied as a capacitor array capable of selectively employing capacitance values to compensate for variation thereof which may occur during a manufacturing process. In this exemplary embodiment of the invention, preferably, the capacitor part C includes a plurality of switches S1 to S4 connected in parallel with one another to a terminal to which the ramp current $I_{RAMP}$ is inputted and a plurality of capacitors C1 to C5 each having one end connected to a corresponding one of the switches S1 to S4 and another end grounded.

The switches can be switched on/off by a control logic 24. That is, in this embodiment, the switches S1 to S4 are controllably switched on/off, thereby selectively employing capacitance values of the capacitors C1 to C5 connected in parallel with one another. Particularly, when the capacitor C1 having a reference capacitance value does not employ a switch, the capacitors C2 to C5 having smaller capacitance values may employ a switch while selectively applying capacitance values, to compensate for variation in the capacitance values.

The ramp and hold circuit 22 supplies the ramp current $I_{RAMP}$ to the capacitor part C to charge the capacitor part during a charging time set according to a period of the oscillation signal generated from the oscillator and maintains a both-end voltage of the capacitor part C after the charging. The charging time is set by the control logic 24 which divides the period of the oscillation signal outputted from the RC oscillator by a predetermined divide ratio. Here, the charging time is proportional to the period of the oscillation signal of the RC oscillator.

The first comparator 23 compares a size of the first reference voltage $V_{REF1}$ with a size of the both-end voltage of the capacitor part C. The first comparator 23 may be configured as a simple inverter type formed of two transistors. In a case where the both-end voltage of the capacitor part C is greater than the first reference voltage $V_{REF1}$, the first comparator 23 converts an output from high to low. The control logic 24 controls the first charge pump 25 to increase or decrease a control voltage of the oscillator 26 in response to the output of the first comparator 23. A more detailed explanation will be given hereunder about operations of the control logic 24 and the first charge pump 23 in response to a comparison result of the first comparator 23.

The control logic 24 outputs a control signal in response to the comparison result of the first comparator 23, receives the oscillation signal through feed-back and sets the charging time during which the ramp and hold circuit 22 supplies the ramp current $I_{RAMP}$ to the capacitor part C. As described above, the charging time is proportional to the period of the oscillation signal outputted from the RC oscillator.

The first charge pump 25 outputs the control voltage varying in response to the control signal of the control logic 24. The oscillator part 26 outputs the oscillation signal having a frequency controlled in response to the control voltage of the first charge pump 25.

Hereinafter, operations of the first comparator 23, the control logic 24, the first charge pump 25 and the oscillator part 26 will be described. In a case where the both-end voltage of the capacitor part C is greater than the first reference voltage $V_{REF1}$ based on the comparison result of the first comparator 23, the control logic 24 provides the control signal for increasing the control voltage $V_{CP}$ of the oscillator part 26 outputted from the first charge pump 25, to the first charge pump 25. Accordingly, the first charge pump 25 increases the control voltage $V_{CP}$ supplied to oscillator part 26, thereby increasing a frequency of the oscillation signal outputted from the oscillator part 26. In contrast, in a case where the both-end voltage of the capacitor C is smaller than the first reference voltage $V_{REF1}$ based on the comparison result of the first comparator 23, the control logic 24 provides the control signal for decreasing the control voltage $V_{CP}$ of the oscillator part 26 outputted from the first charge pump 25, to the first charge pump 25. Accordingly, the first charge pump 25 decreases the control voltage $V_{CP}$ supplied to the oscillator part 26, thereby decreasing the frequency of the oscillation signal outputted from the oscillator part 26.

The self-calibrating RC oscillator according to an exemplary embodiment of the invention may further include a crystal resonance part 31, a phase frequency detector 32, a second charge pump 33, and a second comparator 34. The crystal resonance part 31 generates a reference frequency from a resonance signal generated from a crystal resonator. The phase frequency detector 32 compares a frequency of the oscillation signal with the reference frequency. The second charge pump 32 outputs a comparison voltage controlled in response to a comparison result of the phase frequency detector 32. The second comparator compares the comparison voltage outputted from the second charge pump 32 with a preset second reference voltage to provide to the control logic 24.

With these additional constituents, when the RC oscillator initially operates, the oscillator part 26 outputs the oscillation signal controlled by the crystal resonance part 31 which generates a relatively precise frequency. Then, the capacitor part C has the capacitance value determined to output the oscillation signal controlled by the crystal resonance part 31. Thus, the control logic 24 controls on/off of the switches S1 to S4 of the capacitor part C. This configuration is effective in determining the capacitance value of the capacitor part C when the RC oscillator starts operating. After the capacitance value of the capacitor part C is determined, the crystal resonance part 31, the phase frequency detector 32, the second charge pump 33 and the second comparator 34 may be all turned off to reduce unnecessary power consumption.

As set forth above, according to exemplary embodiments of the invention, a first resistor having a resistance value decreasing with increase in temperature is connected in series with a second resistor having a resistance value increasing with increase in temperature. This ensures an RC oscillator to be significantly reduced in variations of an oscillation frequency, caused by temperature-induced variation in a resistance value.

While the present invention has been shown and described in connection with the preferred embodiments, it will be apparent to those skilled in the art that modifications and variations can be made without departing from the spirit and scope of the invention as defined by the appended claims.

What is claimed is:

1. A self-calibrating resistor-capacitor oscillator for generating an oscillation signal comprising:

a resistor part including a first resistor having a resistance value reduced with increase in temperature and a second resistor connected in series with the first resistor and having a resistance value increasing with increase in temperature, the resistor part having a resistance value formed by the first and second resistors connected in series with each other;

a bias circuit generating a preset first reference voltage, and a ramp current to be proportional to the first reference voltage and inversely proportional to the resistance value of the resistor part;

a capacitor part having a capacitance value;

a ramp and hold circuit supplying the ramp current to the capacitor part to charge the capacitor part during a charging time set according to a period of the oscillation signal, and maintaining a both-end voltage of the capacitor part after the charging;

a first comparator comparing a size of the first reference voltage with a size of the both-end voltage of the capacitor part;

a first charge pump for outputting a control voltage varying in response to a control signal;

a control logic outputting the control signal for increasing and decreasing the control voltage outputted from the first charge pump in response to a comparison result of the first comparator, receiving the oscillation signal through feed-back, and setting the charging time during which the ramp and hold circuit supplies the ramp current to the capacitor part, in response to the received oscillation signal; and an oscillator part for outputting the oscillation signal having a frequency controlled in response to the control voltage of the first charge pump.

2. The self-calibrating resistor-capacitor oscillator of claim 1, wherein the capacitor part comprises:

a plurality of switches connected in parallel with one another to a terminal to which the ramp current is inputted; and a plurality of capacitors each having one end connected to a corresponding one of the switches and another end grounded, wherein the control logic controls on/off of the switches.

3. The self-calibrating resistor-capacitor oscillator of claim 2, further comprising:

a crystal resonance part generating a reference frequency from a resonance signal generated from a crystal resonator;

a phase frequency detector for comparing a frequency of the oscillation signal with the reference frequency;

a second charge pump for outputting a comparison voltage controlled in response to a comparison result of the phase frequency detector; and a second comparator for comparing the comparison voltage outputted from the second charge pump with a preset second reference voltage to provide to the control logic, wherein the control logic controls on/off of the switches in response to a comparison result of the second comparator to determine the capacitance value of the capacitor part.

4. The self-calibrating resistor-capacitor oscillator of claim 3, further comprising a storage for storing on/off status of the switches in response to the comparison result of the second comparator.

* * * * *